(12) United States Patent
Romm et al.

(10) Patent No.: US 10,134,600 B2
(45) Date of Patent: Nov. 20, 2018

(54) DIELECTRIC CONTACT ETCH

(71) Applicant: Lam Research Corporation, Fremont, CA (US)

(72) Inventors: Leonid Romm, Pleasanton, CA (US); Alan Jensen, Tracy, CA (US); Xin Zhang, Los Altos, CA (US); Gerardo Delgadino, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/425,901

(22) Filed: Feb. 6, 2017

(65) Prior Publication Data

US 2018/0226260 A1    Aug. 9, 2018

(51) Int. Cl.
| | | |
|---|---|---|
| *H01L 21/30* | (2006.01) | |
| *H01L 21/3065* | (2006.01) | |
| *H01L 21/308* | (2006.01) | |
| *H01L 29/66* | (2006.01) | |
| *H01L 21/67* | (2006.01) | |

(52) U.S. Cl.
CPC ...... *H01L 21/3065* (2013.01); *H01L 21/3081* (2013.01); *H01L 21/67069* (2013.01); *H01L 29/66795* (2013.01)

(58) Field of Classification Search
CPC ........... H01L 21/3065; H01L 21/67069; H01L 21/3081; H01L 29/66795
See application file for complete search history.

(56) References Cited

U.S. PATENT DOCUMENTS

| | | | |
|---|---|---|---|
| 9,627,221 B1* | 4/2017 | Zaitsu | ............... H01L 21/31116 |
| 2008/0188082 A1 | 8/2008 | Chi et al. | |
| 2010/0055921 A1 | 3/2010 | Mitchell et al. | |
| 2015/0228499 A1* | 8/2015 | Parkinson | ......... H01L 21/31116 |
| | | | 438/694 |
| 2015/0270140 A1 | 9/2015 | Gupta et al. | |
| 2015/0279960 A1 | 10/2015 | Lee et al. | |
| 2015/0325479 A1 | 11/2015 | Indrakanti et al. | |
| 2016/0196984 A1 | 7/2016 | Lill | |
| 2016/0247688 A1 | 8/2016 | Zhu et al. | |
| 2016/0359008 A1 | 12/2016 | Choi et al. | |

FOREIGN PATENT DOCUMENTS

KR    10-2015-0142627    12/2015

OTHER PUBLICATIONS

Notice of Allowance from U.S. Appl. No. 15/425,899 dated Jun. 26, 2017.
U.S. Appl. No. 15/425,899, filed Feb. 6, 2017.
(Continued)

*Primary Examiner* — Duy Vu N Deo
*Assistant Examiner* — Mahmoud Dahimene
(74) *Attorney, Agent, or Firm* — Beyer Law Group LLP (57) ABSTRACT

A method for forming a semiconductor device in a plasma processing chamber is provided. An atomic layer etch selectively etches SiO with respect to SiN and deposits a fluorinated polymer. The fluorinated polymer layer is stripped, comprising flowing a stripping gas comprising oxygen into the plasma processing chamber, forming a plasma from the stripping gas, and stopping the flow of the stripping gas. A SiN layer is selectively etched with respect to SiO and SiGe and Si.

20 Claims, 8 Drawing Sheets

(56) References Cited

OTHER PUBLICATIONS

U.S. Appl. No. 15/463,374, filed Mar. 20, 2017.
International Search Report from International Application No. PCT/US2018/012986 dated May 9, 2018.
Written Opinion from International Application No. PCT/US2018/012986 dated May 9, 2018.
International Search Report from International Application No. PCT/US2018/012997 dated May 4, 2018.
Written Opinion from International Application No. PCT/US2018/012997 dated May 4, 2018.

* cited by examiner

DIELECTRIC CONTACT ETCH

BACKGROUND

The disclosure relates to a method of forming semiconductor devices on a semiconductor wafer. More specifically, the disclosure relates to fin transistors.

In forming semiconductor devices, FinFET fabrication and epitaxy may be used to provide fin transistors.

SUMMARY

To achieve the foregoing and in accordance with the purpose of the present disclosure, a method for forming a semiconductor device in a plasma processing chamber is provided. An atomic layer etch selectively etches SiO with respect to SiN and deposits a fluorinated polymer. The fluorinated polymer layer is stripped, comprising flowing a stripping gas comprising oxygen into the plasma processing chamber, forming a plasma from the stripping gas, and stopping the flow of the stripping gas. A SiN layer is selectively etched with respect to SiO and SiGe and Si.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
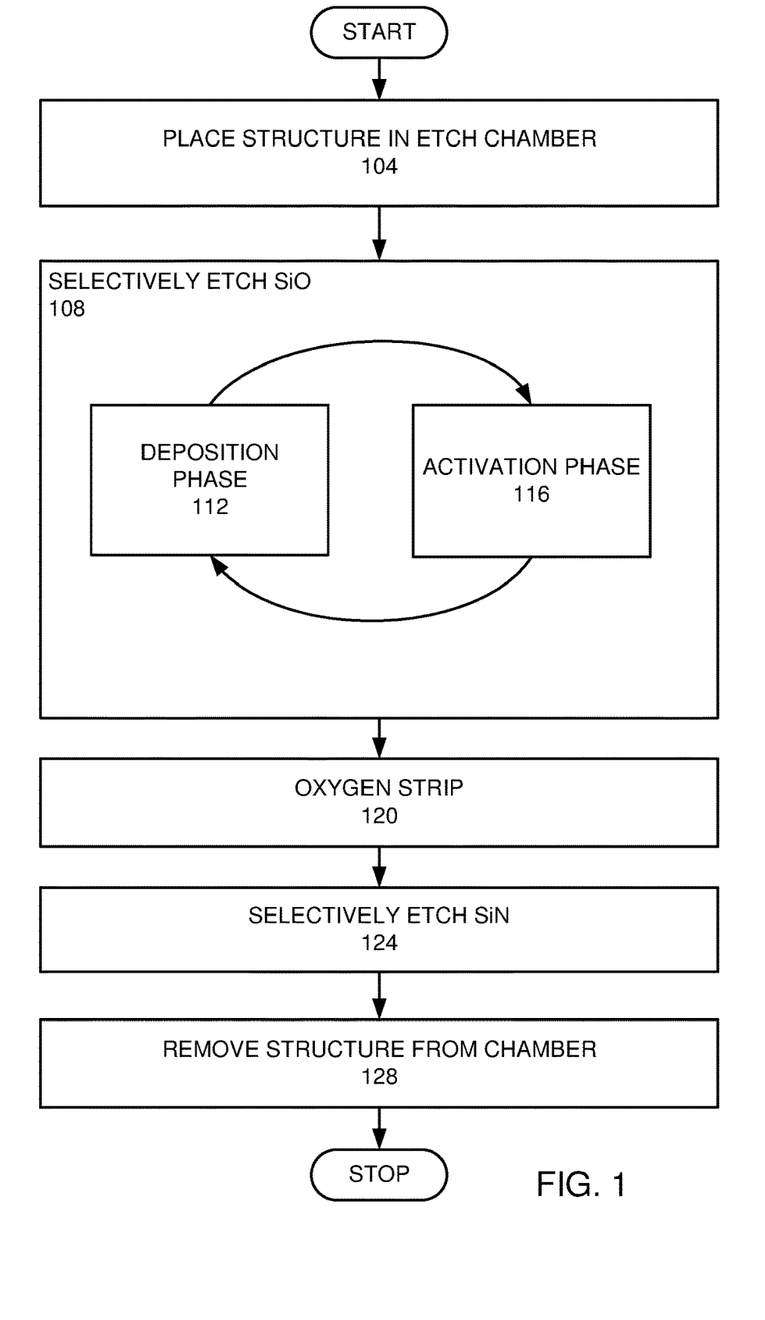
FIG. 1 is a high level flow chart of an embodiment.
Figure 2:
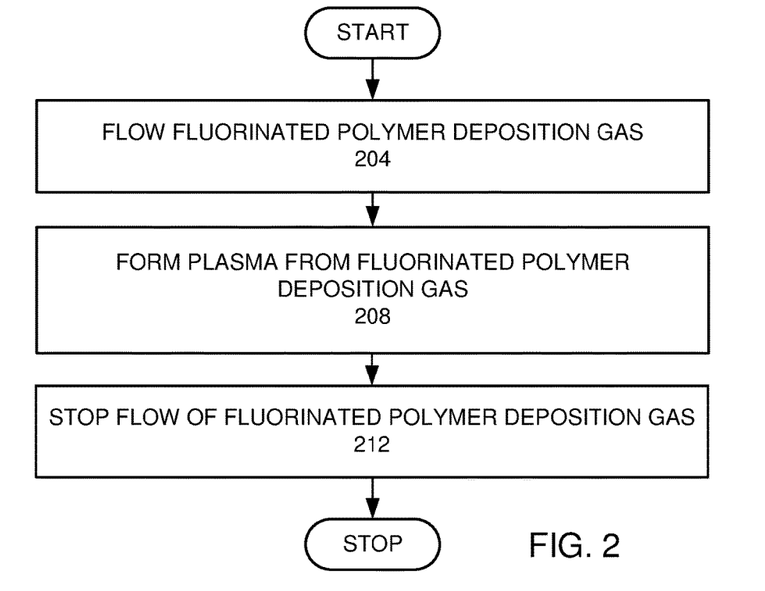
FIG. 2 is a more detailed flow chart of the fluorinated polymer deposition phase.
Figure 3:
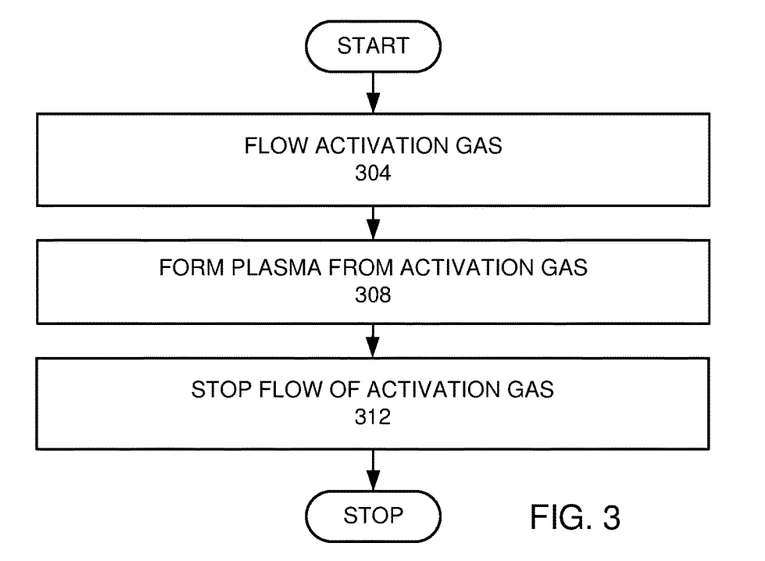
FIG. 3 is a more detailed flow chart of the activation phase.

FIG. 1 is a high level flow chart of an embodiment. In this embodiment, a substrate with a structure, such as a FinFET structure with epitaxial growth, is placed in a plasma processing chamber (step 104). A cyclical atomic layer etching of SiO is provided (step 108). Each cycle of the atomic layer etching process comprises a fluorinated polymer deposition phase (step 112) and an activation phase (step 116). The unwanted fluorinated polymer is stripped using an oxygen strip (step 120). A SiN layer is selectively etched (step 124). The substrate with the structure is removed from the plasma processing chamber (step 128). FIG. 2 is a more detailed flow chart of fluorinated polymer deposition phase (step 112). A fluorinated polymer deposition gas is flowed into the plasma processing chamber (step 204). The fluorinated polymer deposition gas is formed into a plasma, which deposits fluorocarbon polymer on the structure (step 208). The flow of the fluorinated polymer deposition gas is stopped (step 212). FIG. 3 is a more detailed flow chart of activation phase (step 116). An activation gas is flowed into the plasma processing chamber, where the activation gas comprises an inert bombardment gas (step 304). The activation gas is formed into a plasma, which activates fluorine and carbon in the fluorinated polymer, which causes SiO to be selectively etched with respect to SiN (step 308). The flow of the activation gas is stopped (step 312).

EXAMPLE

Figure 4A:
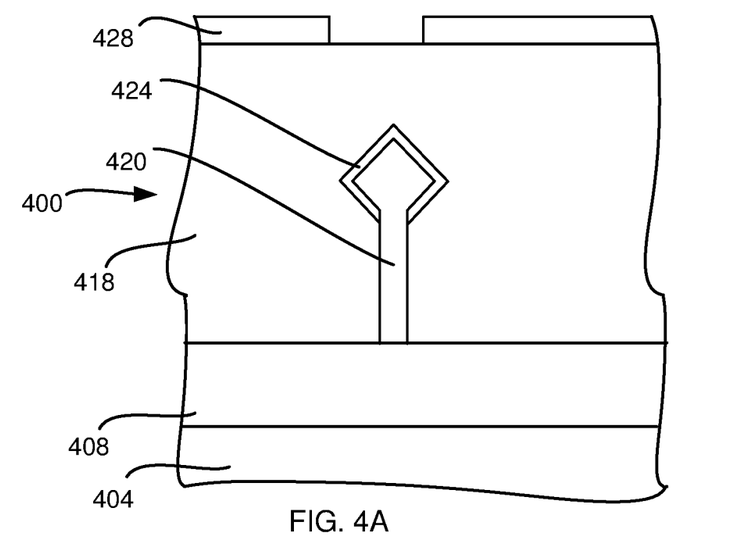
FIGS. 4A-F are schematic cross-sectional views of a structure processed according to an embodiment.

In an example, a substrate with a structure is placed in a plasma processing chamber (step 104). FIG. 4A is a schematic cross-sectional view of a structure 400, with a substrate 404, under a silicon layer 408, under a dielectric layer 418 with a FinFET structure 420. The FinFET structure 420 is of either SiGe or Si or a combination thereof. In the specification and claims, SiGe or Si includes doped and undoped SiGe or Si. The top of the FinFET structure 420 has been enlarged using epitaxy. A coated etch stop layer 424 of SiN has been conformally deposited around the enlarged top of the FinFET structure 420. A hardmask 428 is formed over the dielectric layer 418.

Figure 5:
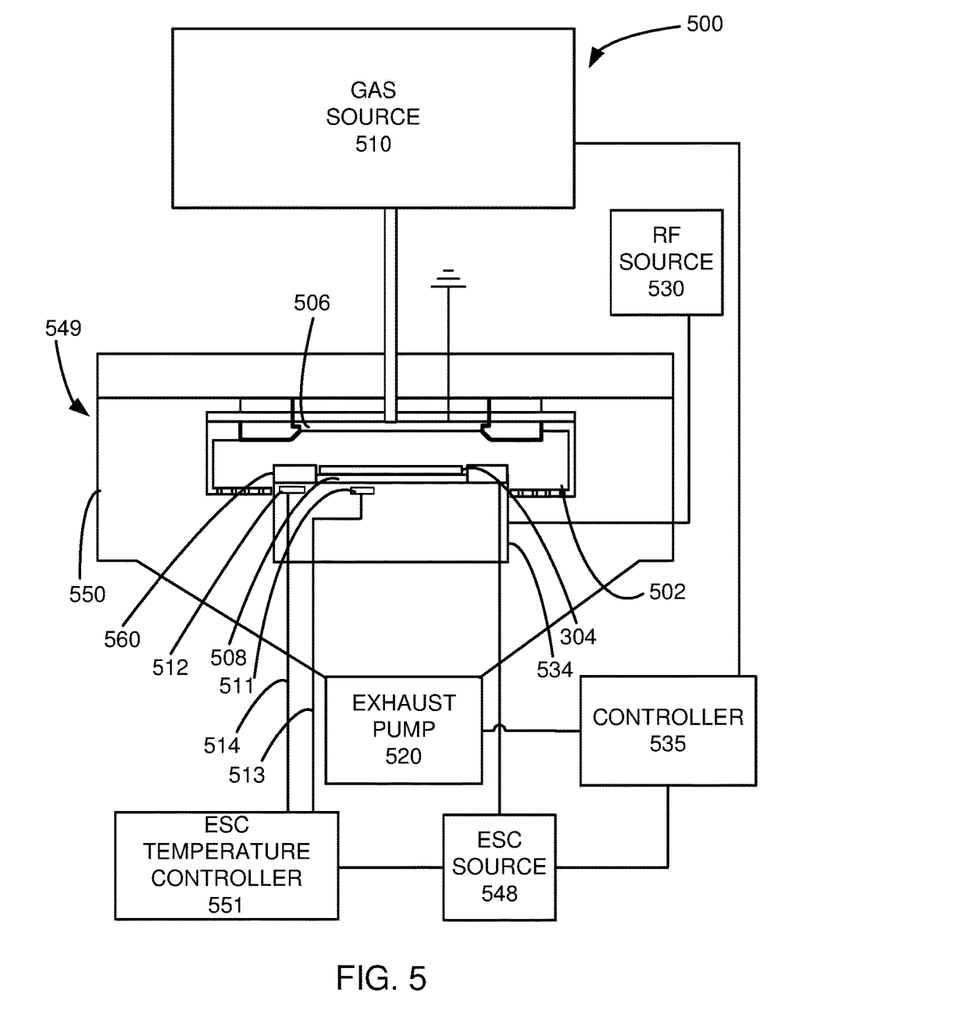
FIG. 5 is a schematic view of a plasma processing chamber that may be used in an embodiment.

FIG. 5 is a schematic view of a plasma processing chamber that may be used in an embodiment. In one or more embodiments, the plasma processing system 500 comprises a gas distribution plate 506 providing a gas inlet and an electrostatic chuck (ESC) 508, within a processing chamber 549, enclosed by a chamber wall 550. Within the processing chamber 549, the substrate 404 is positioned on top of the ESC 508. The ESC 508 may provide a bias from the ESC source 548. A gas source 510 is connected to the plasma processing chamber 549 through the distribution plate 506. The gas source 510 comprises multiple gas sources. An ESC temperature controller 551 is connected to the ESC 508, and provides temperature control of the ESC 508. In this example, a first connection 513 provides power to an inner heater 511 for heating an inner zone of the ESC 508, and a second connection 514 provides power to an outer heater 512 for heating an outer zone of the ESC 508. An RF source 530 provides RF power to a lower electrode 534. An upper electrode, in this embodiment, is the gas distribution plate 506 and is electrically grounded. In a preferred embodiment, 2 MHz, 60 MHz, and 27 MHz power sources make up the RF source 530 and the ESC source 548. In this embodiment, one generator is provided for each frequency. In other embodiments, the generators may be in separate RF sources, or separate RF generators may be connected to different electrodes. For example, the upper electrode may have inner and outer electrodes connected to different RF sources. A controller 535 is controllably connected to the RF source 530, the ESC source 548, an exhaust pump 520, and the etch gas source 510. An example of such a plasma processing chamber is the Exelan Flex™ etch system manufactured by Lam Research Corporation of Fremont, Calif. The process chamber can be a CCP (capacitive coupled plasma) reactor or an ICP (inductive coupled plasma) reactor.

Figure 6:
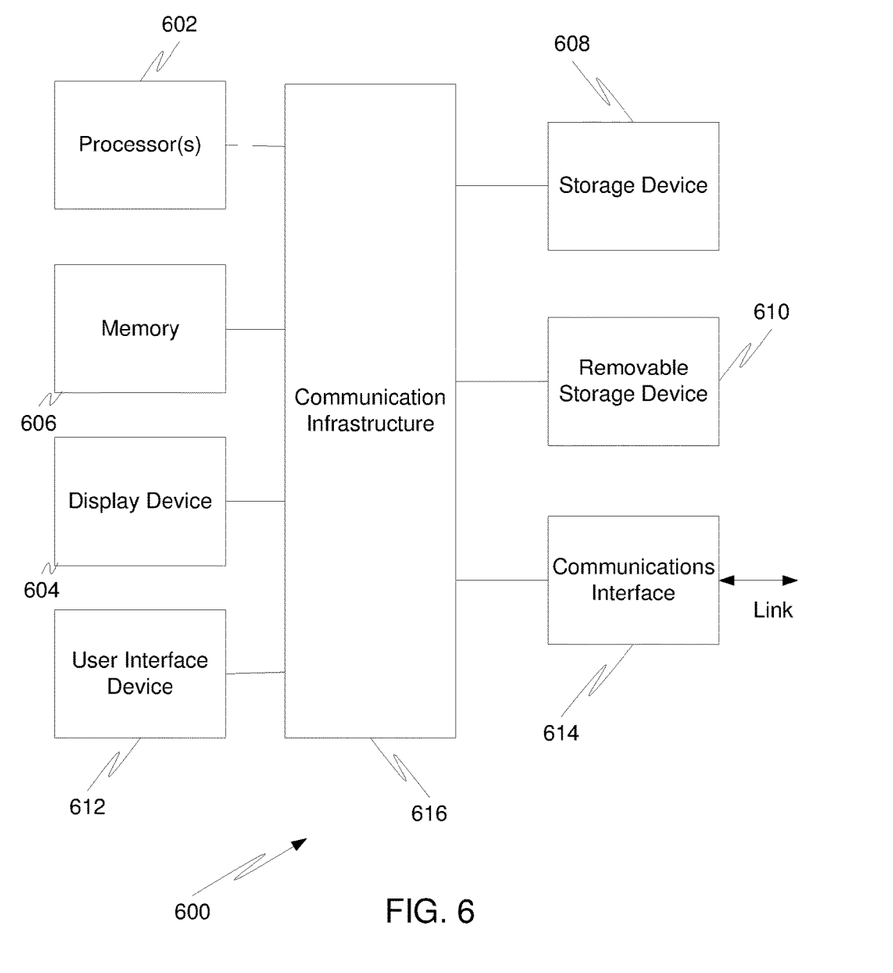
FIG. 6 is a schematic view of a computer system that may be used in practicing an embodiment.

FIG. 6 is a high level block diagram showing a computer system 600, which is suitable for implementing a controller 535 used in embodiments. The computer system may have many physical forms ranging from an integrated circuit, a printed circuit board, and a small handheld device, up to a huge super computer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) to which the aforementioned devices/modules are connected.

Information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

After the structure 400 with the substrate 404 has been placed into the plasma processing chamber 549, cyclical atomic layer etching is provided (step 108). Each cycle of the atomic layer etching process comprises a fluorinated polymer deposition phase (step 112) and an activation phase (step 116). FIG. 2 is a more detailed flow chart of fluorinated polymer deposition phase (step 112). A fluorinated polymer deposition gas is flowed into the plasma processing chamber (step 204). In this embodiment, the flowing the fluorinated polymer deposition gas flows between 1 to 20 sccm of $C_4F_6$, 1 to 520 sccm $O_2$, 10 to 300 sccm CO, and 100 to 1000 sccm Ar. The fluorinated polymer deposition gas is formed into a plasma, which deposits fluorocarbon polymer on the structure (step 208). RF power is provided at 60 MHz and/or 27 MHz at a power between 0-200 Watts is provided to transform the deposition gas into a plasma. The flow of the fluorinated polymer deposition gas is stopped (step 212) after 1 to 15 seconds. Other Fluorocarbons can be used as depositing gases.

Figure 4B:
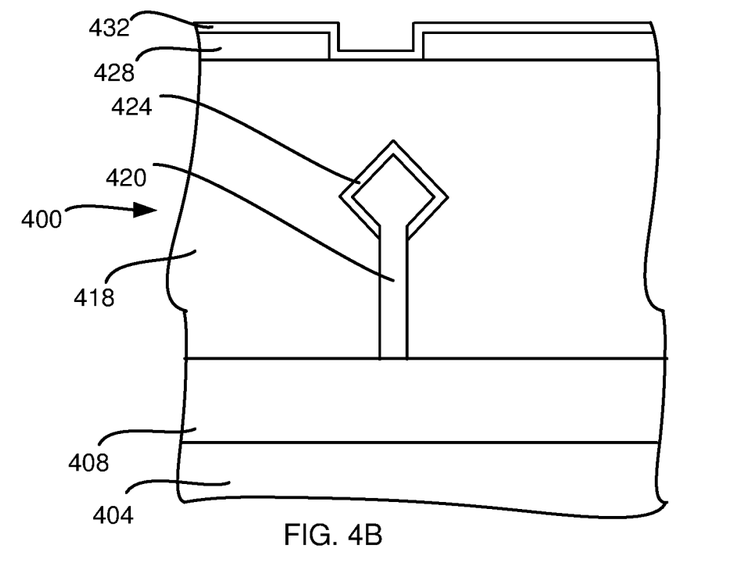

FIG. 4B is a schematic cross-sectional view of a structure 400 after the fluorinated polymer deposition phase is completed. A thin conformal layer or coating of fluorinated polymer 432 is deposited on the structure 400. The coating of fluorinated polymer 432 is not drawn to scale, but is drawn thicker to better facilitate understanding.

FIG. 3 is a more detailed flow chart of activation phase (step 116). An activation gas is flowed into the plasma processing chamber, where the activation gas comprises an inert bombardment gas (step 304). In this example, the activation gas comprises 100-1000 sccm Ar only. In this example, the activation gas is Hydrogen free. The activation gas is formed into a plasma, which activates fluorine and carbon in the fluorinated polymer, which causes SiO to be selectively etched with respect to SiN, SiGe, Si, and doped Si (step 308). In this example, 30-400 Watts of RF power is provided at 60 MHz and 30-300 Watts of RF power is provided at 27 MHz. The flow of the activation gas is stopped (step 312) after a few seconds.

Figure 4C:
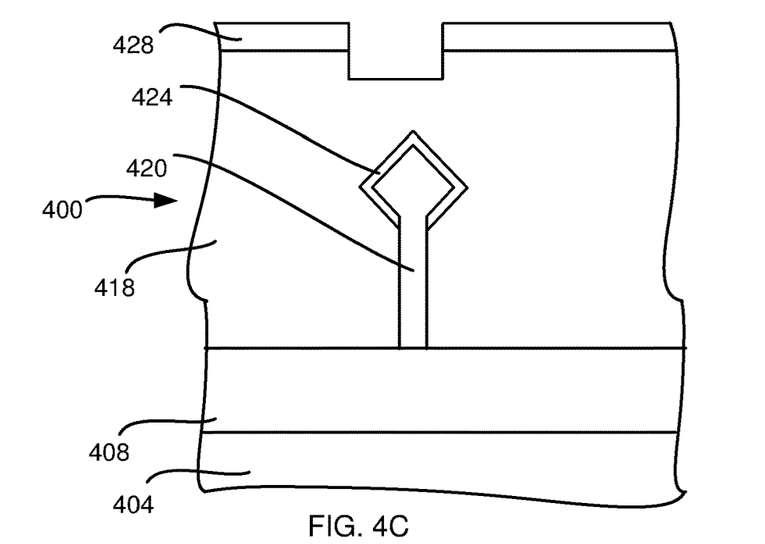

FIG. 4C is a schematic cross-sectional view of a structure 400 after the activation phase is completed. The plasma generated from the inert bombardment gas activates the fluorine and carbon in the fluorinated polymer, which cause part of the dielectric layer 418 to be etched with respect to SiN. A layer of the dielectric layer 418 is shown as being etched away.

Figure 4D:
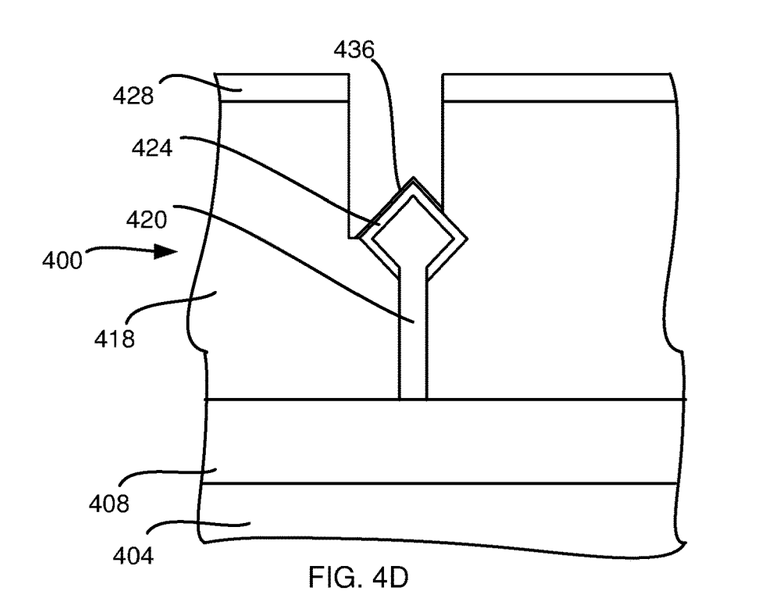

The cyclical process is repeated many times. In this example, the process is repeated from 5-50 times. FIG. 4D is a schematic cross-sectional view of a structure 400 after the atomic layer etch has been performed for 15 cycles. The atomic layer etch selectively etched the SiO layers with respect to SiN, SiGe, Si, and doped Si. A fluorinated polymer layer 436 is deposited over an exposed part of the etch stop layer 424.

Figure 7:
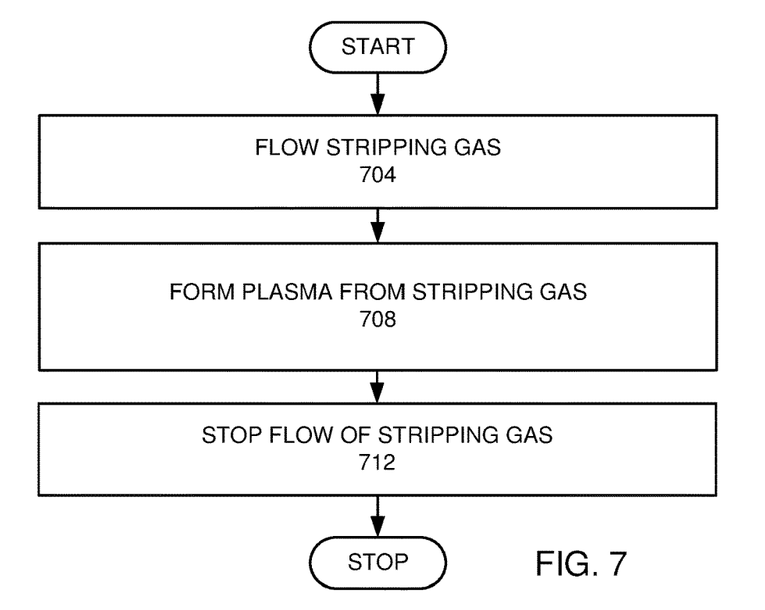
FIG. 7 is a more detailed flow chart of the oxygen stripping process.

An oxygen strip is provided to strip the fluorinated polymer layer (step 120). FIG. 7 is a more detailed flow chart of the oxygen strip in this example (step 120). A stripping gas comprising oxygen is flowed into the plasma processing chamber (step 704). In this example the stripping gas is 200-2000 sccm $O_2$. The strip may comprise other gases like CO2, CO and or noble gases. The stripping gas is formed into a plasma (step 708). In this example, RF power is provided at 200 Watts at 60 MHz. The flow of the stripping gas is stopped (step 712).

Figure 4E:
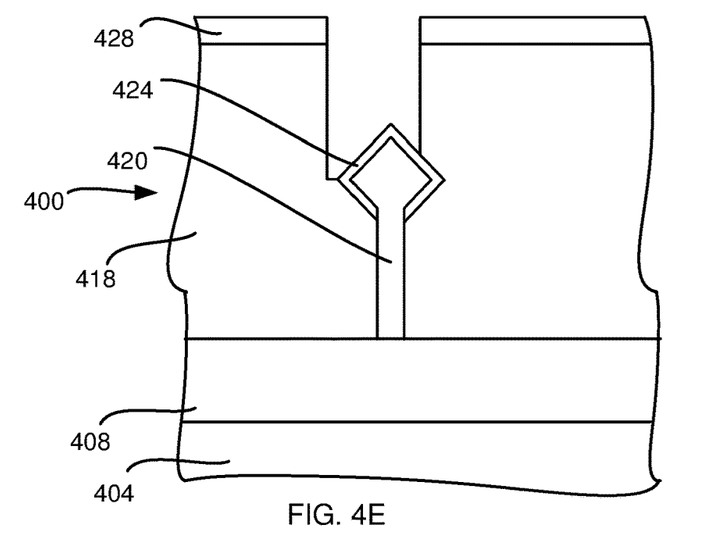

FIG. 4E is a schematic cross-sectional view of a structure 400 after the oxygen strip is completed. The fluorinated polymer layer has been stripped, without removing the etch stop layer 424.

Figure 8:
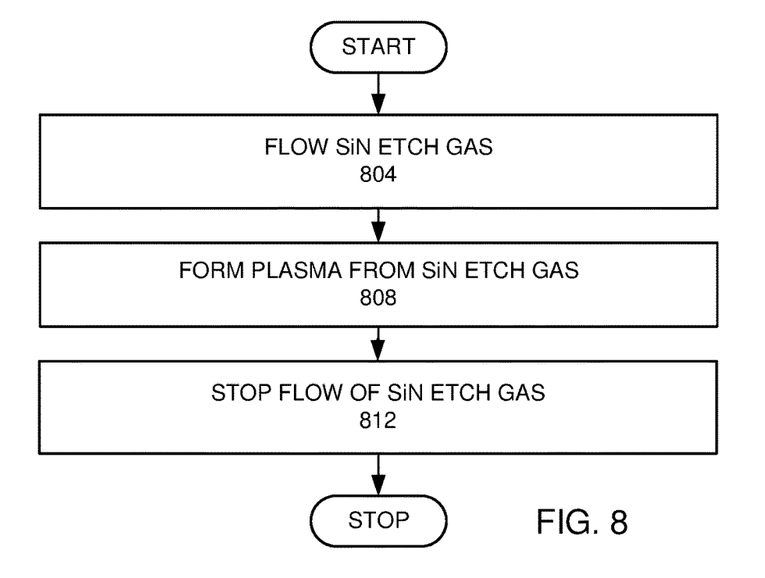
FIG. 8 is a more detailed flow chart of the SiN etching process.

The SiN is selectively etched (step 124). FIG. 8 is a more detailed flow chart of selectively etching SiN (step 124). A SiN etch gas is flowed into the plasma processing chamber (step 804). In this example, the SiN etch gas is 10-200 sccm $CH_3F$ and 100-800 sccm $H_2$. The SiN etch gas is formed into a plasma (step 808). In this example, the RF power is provided at a frequency of 60 MHz and a power between 50 and 250 W. The RF power is pulsed at a 50% duty cycle with a frequency between 50-500 Hz. The flow of the stripping gas is stopped (step 812). Other hydrofluorocarbons and hydrocarbons can be added.

Figure 4F:
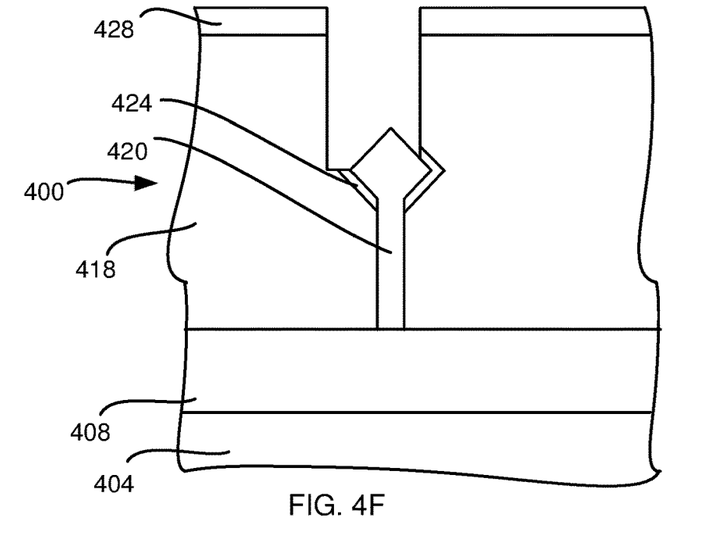

FIG. 4F is a schematic cross-sectional view of a structure 400 after the SiN of the etch stop layer 424 is selectively etched. The etch stop layer 424 is selectively etched so that the SiO of the dielectric layer 418 and the FinFET structure 420 have minimal etching.

The substrate 404 with the structure 400 is removed from the plasma processing chamber (step 128). Additional steps may be performed before the structure 400 is removed from the plasma processing chamber.

It was found that the atomic layer etch has a SiO to SiN etch selectivity greater than 10:1. In some embodiments, the thickness of the etch stop layer 424 is less than 5 nm. Without such a high SiO to SiN etch selectivity during the etching of the SiO dielectric layer 418, the etch stop layer 424 may be etched away to expose the epitaxial part of the FinFET structure 420, which may damage the device and cause defects. In order to selectively etch the etch stop layer 424 with respect to SiO, SiGe, and Si, the fluorinated polymer must be sufficiently removed. It has been found that stripping the fluorinated polymer without oxygen does not sufficiently remove the fluorinated polymer. The prior art avoided the use of oxygen in such processes, since oxygen would damage the epitaxy part of the FinFET structure 420. Because of the high selectivity of the atomic layer etch, the etch stop layer 424 is not over etched and provides sufficient protection of the FinFET structure 420 to prevent damage from oxygen. The use of oxygen in stripping sufficiently removes the fluorinated polymer, so that the SiN may be highly selectively etched. The etch selectivity of SiN to SiO is at least 10:1 in steady state. In addition, the etch selectivity of SiN to SiGe and Si is at least 10:1 in steady state. Without a high selectivity for etching SiN with respect to SiO, etching the SiN would further etch and change the dielectric layer 418. Without high etch selectivity for etching SiN with respect to SiGe and Si, etching the SiN could damage the FinFET structure 420, causing device performance degradation. In addition, the atomic layer etch of SiO was unexpectedly found to have various embodiments that are able to provide small CD etch wrap around, which allows etching around a structure, and then past the structure. Etch wrap around improves the resulting contacts, since etch wrap around provides a contact along the angled surface of the epitaxy portion of the FinFET structure 420. In various embodiments, one or more layers may be between or over or under the various layers. In various embodiments, additional steps or phases may be added. In other embodiments, the various steps may be performed in different processing chambers. For example, the stripping may be performed in a different chamber than the atomic layer etching of SiO.

In addition to a fluorocarbon, the fluorinated polymer deposition gas may further comprise CO, $O_2$, $CO_2$, and/or Ar. The CO provides more carbon deposition on top of areas with low aspect ratios than areas with high aspect ratios, which further slows the etching of SiN in low aspect ratio regions. Preferably, the activation gas is fluorine free. Preferably, the activation gas is hydrogen free. Preferably, the bias voltage during the fluorinated polymer deposition phase and the activation phase has a magnitude of less than 200 volts.

The amount or thickness of the fluorinated polymer provides a self-limitation of the amount of etching during the activation phase. In the specification and claims, atomic layer etching is defined as a self-limited etching process, such as the self-limitation of the activation process due to the limited presence of fluorinated polymer.

Preferably, the SiO is selectively etched with respect to SiGe and Si at a ratio of at least 10:1. More preferably, the SiO is selectively etched with respect to SiGe and Si at a ratio of at least 20:1. Preferably, the SiO is selectively etched with respect to SiN at a ratio of at least 10:1. More preferably, the SiO is selectively etched with respect to SiN at a ratio of at least 20:1. Preferably, the SiN is selectively etched with respect to SiGe and Si at a ratio of at least 10:1. More preferably, the SiN is selectively etched with respect to SiGe and Si at a ratio of at least 20:1. Preferably, the SiN is selectively etched with respect to SiO at a ratio of at least 10:1. More preferably, the SiN is selectively etched with respect to SiO at a ratio of at least 20:1. In various embodiments, the doped Si may be silicon doped with carbon, phosphorus, or boron.

Embodiments offer a way to substantially improve the performance of a device, by tightly controlling critical dielectric etch process set points and parameters. In particular, dielectric contact etch requirements lead to prolonged exposure to plasma of the parts of transistor. This can cause irreversible damage of the source and drain epitaxial growth region (epi) of the fin transistor and hence, degrade device performance.

Even though design of a device provides certain protection of a transistor's active areas, usually a thin silicon nitride (SiN) layer separating dielectric (typically silicon oxide or just oxide) and active two-dimensional areas of a transistor, this SiN layer may be removed non-selectively to oxide on the same process step called "over-etch" (OE). If the SiN layer is too thin (<5 nm), in the prior art, it will definitely be removed, causing unwanted exposure to powerful OE plasma and, hence, epi damage expressed in the physical loss of epi material in the regions of epitaxial growth most critical in the device performance.

Various embodiments provide a way to stop on a thin (~4 nm) SiN layer protecting epitaxial growth, during an oxide OE recipe step, and then gently remove the SiN layer, causing minimal or no damage to underlying epitaxial growth. To achieve this, an atomic layer etch (ALE) technique is used on an oxide OE step to ensure high selectivity to the SiN layer (often called "stop layer"). Once the oxide is cleared, a short strip step is applied to remove unwanted polymer followed by very low power selective SiN removal step (called LRM). This step exhibits excellent selectivity to both oxide still exposed in some areas and epitaxial growth. The epitaxial growth remains practically intact. Since the LRM step is capable of removing SiN selective to epi, the obvious benefit is the increase of contact area between metal of a contact and epi (good epi wraparound). This leads to contact resistance reduction, which further improves device performance.

In various embodiments, a conventional powerful non-selective oxide over-etch recipe step is replaced by a sequence of low power high selectivity steps to minimize or even eliminate a transistor's epi loss, while keeping other critical process specification parameters under control. The "all-in-one" oxide and SiN removal step is replaced with the sequence of recipe steps slated to highly increase selectivity to the appropriate layers, aiming to minimize unwanted material loss.

In various embodiments, for oxide removal selective to underlying SiN, an ALE technique is applied, which is designed to boost oxide/SiN selectivity to 10 and above. This allows the oxide to be removed in the contact, while a SiN stop layer remains in place to protect underlying epi. Once the oxide is cleared with certain amount of over-etch, an oxygen strip is applied to clean up any polymer left over from ALE step, to ensure clean SiN is exposed for the subsequent dedicated SiN removal step. The remaining SiN layer protects Si epitaxial growth from oxidation during the strip. Upon completion of strip step, the SiN removal step (LRM) is applied. This step is developed to remove SiN highly selectively (selectivity >10) to both oxide (e.g. sidewalls of freshly etched contact) and epitaxial growth, where SiN is supposed to be removed from. In other embodiments, the fluorocarbon gas may be one or more of $C_3F_6$, $C_4F_8$, $C_5F_8$, or $C_6F_6$. In addition, preferably fluorocarbon gas does not include hydrofluorocarbons. In other embodiments, the SiN etching gas may use $O_2$ or $CO_2$ in place of or in combination with $H_2$.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for forming a semiconductor device from a structure comprising a silicon oxide layer and a SiN layer and a structure of at least one of SiGe or Si in a plasma processing chamber, comprising:
    providing an atomic layer etch that selectively etches the silicon oxide layer with respect to the SiN layer and deposits a fluorinated polymer layer;
    stripping the fluorinated polymer layer, comprising:
        flowing a stripping gas comprising oxygen into the plasma processing chamber;
        forming a plasma from the stripping gas; and
        stopping the flow of the stripping gas; and
    selectively etching the SiN layer, with respect to the silicon oxide layer and the structure of at least one of SiGe and Si after stripping the fluorinated polymer layer.

2. The method, as recited in claim 1, wherein the stripping gas consists essentially of oxygen.

3. The method, as recited in claim 2, wherein the selective etching of the SiN layer, comprises:
    flowing an etch gas comprising $CH_3F$ and at least one of $H_2$, $O_2$, or $CO_2$ into the plasma processing chamber; and
    forming the etch gas into a plasma.

4. The method, as recited in claim 3, wherein the providing the atomic layer etch, comprises providing a plurality of cycles, wherein each cycle comprises:
    a fluorinated polymer deposition phase, comprising:
        flowing a fluorinated polymer deposition gas comprising a fluorocarbon gas into the plasma processing chamber;
        forming the fluorinated polymer deposition gas into a plasma, which deposits a fluorocarbon polymer layer; and
        stopping the flow of the fluorinated polymer deposition gas into the plasma processing chamber; and
    an activation phase, comprising:
        flowing an activation gas comprising an inert bombardment gas into the plasma processing chamber;
        forming the activation gas into a plasma, wherein the inert bombardment gas activates fluorine and carbon in the fluorinated polymer layer which causes silicon oxide to be selectively etched with respect to SiN; and
        stopping the flow of the activation gas into the plasma processing chamber.

5. The method, as recited in claim 4, wherein the activation gas is hydrogen free.

6. The method, as recited in claim 5, wherein the activation gas is fluorine free.

7. The method, as recited in claim 4, wherein the activation gas consists essentially of Ar.

8. The method, as recited in claim 4, wherein the fluorinated polymer deposition phase provides a bias voltage with a magnitude of less than 200 volts and the activation phase provides a bias with a magnitude of less than 200 volts.

9. The method, as recited in claim 4, wherein the fluorinated polymer deposition phase gas further comprises CO.

10. The method, as recited in claim 9, wherein the fluorinated polymer deposition phase gas further comprises $O_2$ or Ar.

11. The method, as recited in claim 4, wherein the atomic layer etch selectively etches silicon oxide with respect to silicon nitride at a ratio greater than 10:1.

12. The method, as recited in claim 4, wherein the selectively etching the SiN layer selectively etches SiN with respect to SiGe and Si at a ratio of at least 10:1.

13. The method, as recited in claim 4, wherein the semiconductor device comprises a fin transistor with an epitaxial growth region protected by a layer of SiN with a thickness of less than 5 nm.

14. The method, as recited in claim 1, wherein the selective etching of the SiN layer, comprises:
    flowing an etch gas comprising $CH_3F$ and at least one of $H_2$, $O_2$, or $CO_2$ into the plasma processing chamber; and
    forming the etch gas into a plasma.

15. The method, as recited in claim 1, wherein the providing the atomic layer etch, comprises providing a plurality of cycles, wherein each cycle comprises:
    a fluorinated polymer deposition phase, comprising:
        flowing a fluorinated polymer deposition gas comprising a fluorocarbon into the plasma processing chamber;
        forming the fluorinated polymer deposition gas into a plasma, which deposits a fluorocarbon polymer layer; and
        stopping the flow of the fluorinated polymer deposition gas into the plasma processing chamber; and
    an activation phase, comprising:
        flowing an activation gas comprising an inert bombardment gas into the plasma processing chamber;
        forming the activation gas into a plasma, wherein the inert bombardment gas activates fluorine and carbon in the fluorinated polymer layer which causes silicon oxide to be selectively etched with respect to SiN; and
        stopping the flow of the activation gas into the plasma processing chamber.

16. The method, as recited in claim 15, wherein the activation gas consists essentially of Ar.

17. The method, as recited in claim 1, wherein the structure of at least one of SiGe or Si comprises SiGe.

18. The method, as recited in claim 15, wherein the structure of at least one of SiGe or Si comprises a fin transistor with an epitaxial growth region protected by the SiN layer, wherein the SiN layer has a thickness of less than 5 nm.

19. A method for forming a semiconductor device with at least one structure of SiN and at least one structure of silicon oxide and at least one structure of SiGe or Si, in a plasma processing chamber, comprising:
    providing an atomic layer etch that selectively etches the at least one structure of silicon oxide with respect to the at least one structure of SiN and deposits a fluorinated polymer layer;
    stripping the fluorinated polymer layer, comprising:

flowing a stripping gas into the plasma processing chamber;

forming a plasma from the stripping gas; and stopping the flow of the stripping gas; and selectively etching the at least one structure of SiN, with respect to the at least one structure of silicon oxide and the at least one structure of SiGe or Si after stripping the fluorinated polymer layer.

20. The method, as recited in claim 19, wherein the providing the atomic layer etch, comprises providing a plurality of cycles, wherein each cycle comprises:

a fluorinated polymer deposition phase, comprising:

flowing a fluorinated polymer deposition gas comprising a fluorocarbon into the plasma processing chamber;

forming the fluorinated polymer deposition gas into a plasma, which deposits a fluorocarbon polymer layer; and stopping the flow of the fluorinated polymer deposition gas into the plasma processing chamber; and an activation phase, comprising:

flowing an activation gas comprising an inert bombardment gas into the plasma processing chamber;

forming the activation gas into a plasma, wherein the inert bombardment gas activates fluorine and carbon in the fluorinated polymer layer which causes silicon oxide to be selectively etched with respect to SiN; and stopping the flow of the activation gas into the plasma processing chamber.

* * * * *